(12) United States Patent
Boisvert et al.

(10) Patent No.: US 6,924,346 B2
(45) Date of Patent: Aug. 2, 2005

(54) ETCH-STOP RESINS

(75) Inventors: Ronald Boisvert, Midland, MI (US); Stelian Grigoras, Midland, MI (US); David Ha, Midland, MI (US); Brian Harkness, Midland, MI (US); Craig Yeakle, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 17 days.

(21) Appl. No.: 10/491,352

(22) PCT Filed: Oct. 4, 2002

(86) PCT No.: PCT/US02/31824

§ 371 (c)(1),
(2), (4) Date: Apr. 1, 2004

(87) PCT Pub. No.: WO03/035720

PCT Pub. Date: May 1, 2003

(65) Prior Publication Data

US 2004/0186223 A1 Sep. 23, 2004

Related U.S. Application Data

(63) Continuation of application No. 10/066,261, filed on Oct. 22, 2001, now abandoned.

(51) Int. Cl.[7] .............................................. C08G 77/12
(52) U.S. Cl. ........................ 528/31; 528/43; 427/387; 257/E23.167; 257/E21.705; 257/E21.576; 438/781; 106/287.14; 106/287.12

(58) Field of Search ................ 528/31, 43; 106/287.12, 106/287.14; 427/387; 257/E23.167, E21.705, E21.576; 438/781

(56) References Cited

U.S. PATENT DOCUMENTS

| | | | |
|---|---|---|---|
| 4,756,977 A | 7/1988 | Haluska et al. | 428/704 |
| 5,010,159 A | 4/1991 | Bank et al. | 528/23 |
| 5,169,909 A | 12/1992 | Okawa | 525/478 |
| 5,565,384 A | 10/1996 | Havemann | 437/228 |
| 5,614,603 A | 3/1997 | Harkness et al. | 528/14 |
| 5,762,697 A | 6/1998 | Sakamoto et al. | 106/287.16 |
| 5,789,460 A | 8/1998 | Harkness et al. | 522/148 |
| 5,974,666 A | 11/1999 | Tanaka et al. | 29/895.32 |
| 6,020,410 A | 2/2000 | Hacker et al. | 524/267 |
| 6,218,317 B1 | 4/2001 | Allada et al. | 438/780 |
| 6,281,285 B1 | 8/2001 | Becker et al. | 524/837 |

FOREIGN PATENT DOCUMENTS

WO  WO 01/18861 A1  3/2001  ......... H01L/21/768

*Primary Examiner*—Margaret G. Moore
(74) *Attorney, Agent, or Firm*—Sharon K. Brady

(57) ABSTRACT

Silicone resins comprising 5 to 50 mole % of $(PhSiO_{3-x)/2}(OH)_x)$ units and 50 to 95 mole % $(HSiO_{(3-x)/2}(OH)_x)$, where Ph is a phenyl group, x has a value of 0, 1 or 2 and wherein the cured silicone resin has a critical surface free energy of 30 dynes/cm or higher. These resins are useful as etch stop layers for organic dielectric materials having a critical surface free energy of 40 dynes/cm or higher.

18 Claims, No Drawings

ETCH-STOP RESINS

CROSS REFERENCE TO RELATED APPLICATIONS

This present application is a US national stage filing under 35 USC 371 and claims priority from PCT Application No. PCT/US02/31284 entitled "ETCH-STOP RESINS" filed on Oct. 4, 2002, currently pending, which claims priority from U.S. Pat. application Ser. No. 10/066,261 entitled "ETCH-STOP RESINS" filed on Oct. 22, 2001, abandoned.

This invention pertains to silicone resins comprising 5 to 50 mole % of $(PhSiO_{(3-x)/2}(OH)_x)$ units and 50 to 95 mole % $(HSiO_{(3-x)/2}(OH)_x)$, where Ph is a phenyl group, x has a value of 0, 1 or 2 and wherein the cured silicone resin has a critical surface free energy of 30 dynes/cm or higher. These resins are useful as etch stop layers for organic dielectric materials having a critical surface free energy of 40 dynes/cm or higher.

Semiconductor devices often have one or more arrays of patterned interconnect levels that serve to electrically couple the individual circuit elements forming an integrated circuit (IC). The interconnect levels are typically separated by an insulating or dielectric coating. The coatings may be formed by chemical vapor deposition or by spin-on techniques. For example, U.S. Pat. No. 4,756,977 discloses the use of hydrogen silsesquioxane resins to form coatings on electronic devices.

One method for forming the integrated circuits is known as dual damascene. This method involves applying a layer of dielectric, etching the wiring pattern into the dielectric, filling the pattern with wiring metal, and repeating the process until the desired number of levels have been formed.

It has become beneficial to use at least two different materials having differing etch characteristics to produce the dielectric layer. In essence, one dielectric material serves as an etch-stop in etching of the other dielectric. It is preferred that one of the dielectric layers be an organic material while the other be an inorganic material to enhance etch selectivity between the materials. Either dielectric layer may serve as the etch-stop to the other. In oxygen-based plasmas, organic dielectrics tend to etch faster than inorganic dielectrics. In carbon fluoride based plasmas, inorganic dielectrics tend to etch faster than organic dielectrics. Sandwich structures of inorganic, organic, inorganic or organic, inorganic, organic are also useful as the dielectric layer in the integrated circuit.

PCT Patent Application No. WO 01/18861 A1 to Allied-Signal a microelectronic device having a substrate and a first dielectric layer material positioned on the substrate. A layer of a second dielectric material is positioned on the first dielectric layer and an additional layer of the first dielectric material positioned on the second dielectric layer. The organic dielectrics are materials that contain carbon and the inorganic dielectrics are materials that are not carbon containing.

U.S. Pat. No. 6,218,317 discloses the formation of methylated-oxide type hardmasks over polymeric interlayer dielectric materials having a dielectric constant of less than 3 and more preferably 2.7 or less.

When using two or more dielectric layers, it is desirable that the upper material be able to adequately coat the lower level (i.e. wet the surface). It is also desirable to have sufficient adhesion between the layers.

This invention pertains to silicone resins comprising 5 to 50 mole % of $(PhSiO_{(3-x)/2}(OH)_x)$ units and 50 to 95 mole % $(HSiO_{(3-x)/2}(OH)_x)$ where Ph is a phenyl group, x has a value of 0, 1 or 2 and wherein the cured silicone resin has a critical surface free energy of 30 dynes/cm or higher. These resins are useful as etch stop layers for organic dielectrics having a critical surface free energy of 40 dynes/cm or higher.

This invention also pertains to an integrated circuit device having a an organic dielectric layer having a critical surface free energy of 40 dynes/cm or higher and a phenylated-oxide dielectric layer having a critical surface free energy of 30 dynes/cm or higher produced from the silicone resin, wherein at least one surface of the organic dielectric layer contacts a surface of the phenylated-oxide dielectric layer.

This invention pertains to silicone resins comprising 5 to 50 mole % of $(PhSiO_{(3-x)/2}(OH)_x)$ units and 50 to 95 mole % $(HSiO_{(3-x)/2}(OH)_x)$ units based on the total amount of silicon containing units in the resin, where Ph is a phenyl group, x has a value of 0, 1 or 2.

The silicone resins contain 5 to 50 mole % of $(PhSiO_{(3-x)/2}(OH)_x)$ units, alternatively 25 to 50 mole %, alternatively 30 to 45 mole %. Higher amounts of $(PhSiO_{(3-x)/2}(OH)_x)$ in the silicone resin results in higher amounts of carbon in the phenylated dielectric layer. This reduces the etch selectivity between the phenylated-oxide dielectric layer and the organic dielectric layer. Additionally, higher amounts of carbon in the final film contributes to lower adhesion of the phenylated-oxide dielectric layer to the organic dielectric layer.

For the silicone resin to have utility as a dielectric layer in combination with an organic dielectric layer it is desirable to have a critical surface free energy of 30 dynes/cm or higher in cured silicone resin. For every 1 mole % increase in $(PhSiO_{(3-x)/2}(OH)_x)$ in the silicone resin it is theorized that the critical surface free energy in the cured resin increases 0.31 dyne/cm. Thus, higher amounts of $(PhSiO_{(3-x)/2}(OH)_x)$ units in the silicone resin are desirable however, it has been found that as the amount of $(PhSiO_{(3-x)/2}(OH)_x)$ units increase the adhesion of the cured silicone resin to the organic dielectric layer decreases. It is preferred that the cured silicone resin have a critical surface free energy in the range of 35 to 60 dynes/cm, more preferably 35 to 45 dynes/cm.

The structure of the silicone resin is not specifically limited. The silicone resin may be essentially fully condensed or may be only partially condensed. When the silicone resin is partially condensed less than 40 mole % of the units in the silicone resin should contain Si—OH groups. Higher amounts of these units can result in instability in the resin and the formation of gels. Typically 6 to 38 mole % of the units in the silicone resin contain Si—OH groups.

The silicon resin has a weight average molecular weight (Mw) in the range of 500 to 400,000 and preferably in the range of 500 to 100,000, alternatively 700 to 10,000.

Silicone resins useful herein may be exemplified by, but not limited to $(PhSiO_{3/2})_a(HSiO_{3/2})_d$ $(PhSiO_{3/2})_a(PhSiO_{2/2}(OH))_b(HSiO_{3/2})_d$ $(PhSiO_{3/2})_a(PhSiO_{2/2}(OH))_b(HSiO_{3/2})_d(HSiO_{2/2}(OH))_e$ $(PhSiO_{3/2})_a(HSiO_{3/2})_d(HSiO_{2/2}(OH))_e$ $(PhSiO_{3/2})_a(PhSiO2/2(OH))_b(PhSiO_{1/2}(OH)_2)_c(HSiO_{3/2})_d$ $(PhSiO_{3/2})_a(PhSiO_{2/2}(OH))_b(PhSiO_{1/2}(OH)_2)_c(HSiO_{3/2})_d(HSiO_{2/2}(OH))_e$ where a>0, b≧0, c≧0, d>0, e≧0, 0.05≦a+b+c≦0.5, 0.5≦d+e≦0.95 and b+c+e≦0.4.

The resins may be produced by methods known in the art. For example, the resins may be produced by the hydrolysis and condensation of a mixture of a phenyl trialkoxy and hydrogen trialkoxy silane as set forth in U.S. Pat. No. 5,762,697 to Sakamoto et al. Alternatively they may be produced by the hydrolysis and condensation of a phenyl trichlorosilane and hydrogen trichlorosilane as set forth in U.S. Pat. No. 6,281285 to Becker et al. and U.S. Pat. No. 5,010,159 to Bank et al.

The silicone resin is typically produced in the presence of a solvent. Any suitable organic or silicone solvent that does not contain a functional group which may participate in the reaction may be used in producing the silicone resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol dietheyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as isobutyl isobutyrate and propyl propronate. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silicone resin can be carried out at any temperature so long as it does not cause significant gellation or cause curing of the silicone resin. Typically the reaction is carried out at a temperature in the range of 5° C. to 150° C., with ambient temperature suggested.

The time to form the silicone resin is dependent upon a number of factors such as the temperature, the type and amount of silane reactants, and the amount of catalyst, if present. Typically the reaction time is from several minutes to several hours. One skilled in the art will be able to readily determine the time necessary to complete the reaction.

Following completion of the reaction the catalyst may be optionally removed. Methods for removing the catalyst are well know in the art and would include neutralization, stripping or water washing or combinations thereof. The catalyst may negatively impact the shelf life of the silicone resin especially when in solution thus its removal is suggested.

In the process for making the silicone resin, after the reaction is complete, volatiles may be removed from the silicone resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silicone resin a number of optional steps may be carried out to obtain the silicone resin in the desired form. For example, the silicone resin may be recovered in solid form by removing the solvent. The method of solvent removal is not critical and numerous methods are well known in the art (e.g. distillation under heat and/or vacuum). Once the silicone resin is recovered in a solid form, the resin can be optionally re-dissolved in the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

This invention also pertains to forming a dielectric material in an integrated circuit device wherein the dielectric material is comprised of at least one layer of an organic dielectric having a critical surface free energy of at least 40 dynes/cm and a second phenylated-oxide dielectric layer produced from the silicone resin of this invention and having a critical surface free energy of at least 30 dynes/cm.

The benefit of this "dual layer" dielectric material is that one dielectric layer is able to serve as an etch stop layer for the other. Good surface wetting can be achieved by the use of a phenylated-oxide inorganic layer having a critical surface free energy of at least 30 dynes/cm with an organic dielectric having a critical surface free energy of at least 40 dynes/cm. By having good surface wetting one is able to achieve an essentially uniform coating of one material over the other.

The organic dielectric layer may be produced by methods known in the art, using materials known in the art. One suitable organic dielectric material is SiLK™ manufactured by Dow Chemical Co. This material produces a dielectric layer having a critical surface free energy of 53 dynes/cm. SiLK™ may be processed using conventional spin coating techniques and equipment.

The silicon resin may be used to prepare a phenylated-oxide dielectric layer by (I) coating a semiconductor substrate with a silicone resin comprising 5 to 50 mole % of $(PhSiO_{(3-x)/2}(OH)_x)$ units and 50 to 95 mole % of $(HSiO_{(3-x)/2}(OH)_x)$, where Ph is a phenyl group, x has a value of 0, 1 or 2 and (II) heating the coated semiconductor substrate at a temperature sufficient to cure the silicone resin and produce a phenylated-oxide dielectric layer.

The semiconductor substrate may contain an organic dielectric layer, over which the phenylated-oxide dielectric layer is formed. Alternatively the phenylated-oxide dielectric layer may be formed first and the organic dielectric layer is then formed over the phenylated-oxide dielectric layer.

The silicone resin is typically applied to the substrate as a solvent dispersion. Solvents that may be used include any agent or mixture of agents that will dissolve or disperse the silicon resin to form an essentially homogeneous liquid mixture. The solvent is typically a single solvent or mixture of solvents that are used in the reaction to produce the silicone resin, described above. Suggested solvents are propylene glycol methyl ether acetate, cyclohexanone, γ-butyrolacetone, methyl isobutyl ketone, methyl propyl ketone, mesitylene, and silicones.

The amount of solvent is not particularly limited but is typically present in an amount of 40 to 99.5% by weight, alternatively 60 to 99.5% based on the weight of silicone resin and solvent.

Specific methods for application of the silicone resin to the substrate include, but are not limited to, spin-coating, dip-coating, spay-coating, flow-coating, screen-printing and others. The suggested method for application is spin-coating.

When a solvent is used the solvent is removed from the coated substrate following application. Any suitable means for removal may be used such as drying, the application of a vacuum and/or the application of heat (i.e. such as passing a coated wafer over hot plates). When spin coating is used, the additional drying method is minimized since the spinning drives off most of the solvent.

Following application to the substrate, the coated substrate is heated at a temperature to cure the silicone resin. A cured silicone resin is essentially insoluble in a solvent which may be used for it application to the substrate. Typically the coated substrate is heated to a temperature in the range of 100° C. to 600° C. to cure the silicone resin, with 100° C. to 450° C. suggested.

The atmosphere used during the curing of the resin is not particularly limited. Useful atmosphere include oxygen containing atmospheres such as air and inert atmospheres such as nitrogen, and argon. By "inert" it is meant that the environment contain less than 50 ppm and preferably less than 10 ppm of oxygen. The pressure at which the curing and removal steps are carried out is not critical. The curing is typically carried out at atmospheric pressure however, sub or super atmospheric pressures may work also.

Any method of heating may be used to cure the silicone resin. For example, the substrate may be placed in a quartz tube furnace, convection oven, rapid thermal processing or allowed to stand on hot plates. Furnaces are commonly used in the industry to produce cured resin films on integrated circuits.

The layers of dielectric materials may be produced in any order. For example, a layer of organic dielectric may be produced on a semiconductor substrate and thereafter a layer of inorganic dielectric may be formed thereon. Alternatively, a layer of inorganic dielectric may be produced on the semiconductor substrate and thereafter a layer of organic dielectric may be produced thereon. Additionally, sandwich structures or multiple layers may be formed. For example, a layer of organic dielectric may be produced on the substrate followed by a layer of inorganic dielectric, followed by another layer of organic dielectric.

The following non-limiting examples are provided so that one skilled in the art may more readily understand the invention. In the following examples, Ph represents phenyl, Me represents methyl, T represent the unit $SiO_{3/2}$ (i.e. $T^{Ph}=PhSiO_{3/2}$).

Critical surface free energy (surface energy) was measured using contact angle based on a process under ASTM D 724.

Adhesion was measured using a stud pull procedure.

EXAMPLES

Example 1

To ethylene glycol dimethyl ether (EGDME) was added the corresponding alkoxysilanes in the amounts given in the table 1. The solution of EGDME and alkoxysilane was stirred for several minutes, following which deionized water containing 100 ppm nitric acid catalyst was added. The mixture was vigorously stirred at room temperature for 4 days. After stirring propylene glycol methyl ether acetate (PGMEA) was added. The original solvent (ethylene glycol dimethyl ether), residual water, alcohol by-products and residual nitric acid were removed from the solution by rotary evaporation, leaving the resin product (10 wt. %) in propylene glycol methyl ether acetate solution.

Example 2

Ethylene glycol dimethyl ether (EGDME), phenyltrichlorosilane and trichlorosilane were added into a flask reactor in the amounts shown in Table 2. The solution was cooled to 10–12° C., while maintaining the solution under a nitrogen atmosphere. In a separate flask EGDME and water were combined in the amounts shown in Table 2. The water/EGDME solution was added to the chlorosilane/EGDME over the time shown in Table 2. After the addition the solution was allowed to warm to 20° C. and stirred for the time shown in Table 2 (Bodying time) to body the formed resin. 200 grams of propylene glycol methyl ether acetate (PGMEA) was added to the solution. Using a rotary evaporator at 40° C., the solution was concentrated to approximately 21 weight % resin content to remove the EGDME solvent. To the resin solution was then added 30 g of ethanol to the solution and the flask contents rotary evaporated to remove the ethanol and residual water and hydrochloric acid. The solution was then diluted to 10 weight % resin by addition of PGMEA. Example 2—2 was carried out in PGMEA instead of EGDME.

TABLE 1

| Example | HSi(OEt)₃ (grams) | PhSi(OMe)₃ (grams) | Water (grams) | EGDME (grams) | Molecular Weight Mw(Mn) | SiOH level (mole %) | Target Composition* | Actual Composition* |
|---|---|---|---|---|---|---|---|---|
| 1-1 | 100.00 | 40.23 | 43.82 | 370.00 | 1976 (951) | 15.7 | $T^{Ph}_{0.25}T^{H}_{0.75}$ | $T^{H}_{0.71}[T^{H,OH}_{0.07}T^{Ph}_{0.13}T^{Ph,OH}_{0.09}T^{Ph,(OH)2}_{0.01}$ |
| 1-2 | 55.00 | 66.38 | 36.15 | 380.00 | 804 (601) | 38.22 | $T^{Ph}_{0.50}T^{H}_{0.50}$ | $T^{H}_{0.46}[T^{H,OH}_{0.16}T^{Ph}_{0.13}T^{Ph,OH}_{0.23}T^{Ph,(OH)2}_{0.02}$ |
| 1-3 | 130.00 | 22.41 | 48.83 | 356.00 | 2944 (1171) | 17.1 | $T^{Ph}_{0.125}T^{H}_{0.875}$ | $T^{H}_{0.77}[T^{H,OH}_{0.12}T^{Ph}_{0.04}T^{Ph,OH}_{0.05}T^{Ph,(OH)2}_{0.01}$ |
| 1-4 | 160.00 | 4.95 | 53.94 | 350.00 | 9188 (2137) | 14.3 | $T^{Ph}_{0.025}T^{H}_{0.975}$ | $T^{H}_{0.86}[T^{H,OH}_{0.14}T^{Ph}_{0.00}T^{Ph,OH}_{0.01}$ |

*Ratio given in molar values.

TABLE 2

| Example No. | PhSiCl₃ (g) | HSiCl₃ (g) | EGDME 1 (g) | EGDME 2 (g) | Water (g) | Addition Time, hr | Bodying Time, hr | Target Composition* | Actual Composition* |
|---|---|---|---|---|---|---|---|---|---|
| 2-1 | 40 | 63 | 316 | 80 | 23 | 0.75 | 2.00 | $T^{Ph}_{0.25}T^{H}_{0.75}$ | $T^{Ph,OH}_{0.07}T^{Ph}_{0.23}T^{H}_{0.72}$ |
| 2-2 | 42 | 81 | PGMEA 304 | PGMEA 615 | 30 | 2 | 0.75 | $T^{Ph}_{0.25}T^{H}_{0.75}$ | $T^{Ph,OH}_{0.08}T^{Ph}_{0.17}T^{H}_{0.75}$ |
| 2-3 | 81 | 52 | 617 | 121 | 30 | 1 | 1.5 | $T^{Ph}_{0.50}T^{H}_{0.50}$ | $T^{Ph,(OH)2}_{0.07}T^{Ph,OH}_{0.25}T^{Ph}_{0.22}T^{H}_{0.46}$ |

TABLE 2-continued

| Example No. | PhSiCl$_3$ (g) | HSiCl$_3$ (g) | EGDME 1 (g) | EGDME 2 (g) | Water (g) | Addition Time, hr | Bodying Time, hr | Target Composition* | Actual Composition* |
|---|---|---|---|---|---|---|---|---|---|
| 2-4 | 61 | 69 | 612 | 120 | 30 | 1.5 | 3.5 | $T^{Ph}_{0.36}T^H_{0.64}$ | $T^{Ph,(OH)2}_{0.02}T^{Ph,OH}_{0.135}T^{Ph}_{0.2}T^H_{0.64}$ |
| 2-5 | 54 | 74 | 613 | 120 | 30 | 1.5 | 3.5 | $T^{Ph}_{0.32}T^H_{0.68}$ | $T^{Ph,(OH)2}_{0.04}T^{Ph,OH}_{0.14}T^{Ph}_{0.16}T^H_{0.67}$ |

Comparative Example 1

Concentrated hydrochloric acid (37 percent in water), octylsodium sulfate and toluene (1) in the amounts given in Table 3 were combined. The solution was stirrer at 1200 rpm at 20° C. to mix the two phases. Into a separate flask were added toluene (2), trichlorosilane and methyltrichlorosilane in the amounts given in Table 3. The mixture of chlorosilanes and toluene were combined over 4 hours while maintaining vigorous stirring. The resulting resin was bodied for a minimum of 4 hours at 20° C. The stirrer was then stopped and the phases allowed to separate. The concentrated hydrochloric acid phase was removed and discarded. The organic phase was washed 8 times with 1L portions of deionized water. This was continued until a pH of 4 was achieved. The organic phase was transferred to a flask and concentrated to 30 weight percent resin using a rotary evaporator. Toluene was added to the resin solution to decrease the resin concentration to 20 weight percent. To the solution was then added ethanol at a level of 10 weight percent of the total solution weight. The resin was again concentrated with a rotary evaporator to 30 weight percent in order to remove the ethanol and any residual water and hydrochloric acid. The solution was diluted with toluene to 20 weight percent resin.

The resin was purified by fractionation of the resin by adding acetonitrile to the toluene/resin solution. Typically three resin fractions could be isolated by adding acetonitrile to attain a 0.65 ratio of solution/acetonitrile to precipitate the high molecular weight fraction; a 0.13 ratio to precipitate the middle fraction (40–45 percent of the material), with the final solution containing the low molecular weight material. The middle fraction was used for evaluation purposes and had an average molecular weight of 40,000 as measured by 3D light scattering GPC.

These materials were dissolved in cyclohexanone for thin film studies at solids concentrations of 7.5 to 10 wt %.

Comparative Example 2

Resins were prepared using the same procedure as in Example 1 except that Me(OMe)$_3$ was used in place of Ph(OMe)$_3$. The amounts or reactants and resins produced are in Table 4.

TABLE 3

| Example No. | MeSiCl$_3$ (g) | HSiCl$_3$ (g) | HCl (g) | OSS** (g) | Toluene 1 | Toluene 2 | Target Composition* |
|---|---|---|---|---|---|---|---|
| C1-1 | 149 | 406 | 1422 | 10 | 3910 | 700 | $T^{Me}_{0.25}T^H_{0.75}$ |
| C1-2 | 299 | 271 | 1422 | 10 | 3910 | 700 | $T^{Me}_{0.50}T^H_{0.50}$ |

**OSS = Octyl Sodium Sulfate

TABLE 4

| Example | HSi(OEt)$_3$ (grams) | MeSi(OMe)$_3$ (grams) | Water (grams) | EGDME (grams) | Target Composition* |
|---|---|---|---|---|---|
| C2-1 | 30.42 | 40.23 | 13.82 | 100.00 | $T^{Me}_{0.25}T^H_{0.75}$ |
| C2-2 | 20.21 | 16.9 | 13.92 | 100 | $T^{Me}_{0.50}T^H_{0.50}$ |

Example 4

Samples from Examples 1 and 2 were diluted in PGMEA to a concentration of 1 to 3 wt %, filtered and spin-coated onto silicon wafers. The spin rates were selected in the range of 2000 to 5000 RPM to achieve as-spun thickness in the range of 250 angstroms. The coated wafers were heated in a rapid thermal processor in a nitrogen atmosphere at 250° C. for two minutes to produce the phenylated-oxide coating. Results are given Table 4.

A second phenylated-oxide layer was produced over the first using the same procedures as above. Results of the film quality (film on film) are given in Table 1.

TABLE 5

| Example Material | Film Quality (Si Wafer) | Surface Energy 250° C. Cure | Dk | Adhesion | Film Quality (film on film) |
|---|---|---|---|---|---|
| 1-1 | no dewets | 34 | 3.06 | 43.9 | dewets |
| 1-2 | small pores | 41 | 3.01 | 13.4 | small pores |
| 1-3 | no dewets | 31 | 3.04 | 65.3 | dewets |
| 1-4 | no dewets | 31 | 3.09 | 59.8 | dewets |
| 2-1 | no dewets | 37.1 | — | 47.3 | no dewets |
| 2-2 | no dewets | 40.1 | 3.32 | 43.9 | no dewets |
| 2-3 | no dewets | 40.8 | 3.10 | 4.4 | no dewets |
| 2-4 | no dewets | 37 | 3.35 | 60.6 | no dewets |
| 2-5 | no dewets | 35.5 | 3.38 | 59.1 | no dewets |

Comparative Example 3

Samples from Comparative Examples 1 and 2 were diluted in PGMEA to a concentration of 1 to 3 wt %, filtered and spin-coated onto silicon wafers. The spin rates were selected in the range of 2000 to 5000 RPM to achieve as-spun thickness in the range of 250 angstroms. The coated wafers were heated in a rapid thermal processor in a nitrogen atmosphere at 250° C. for two minutes to produce a methylated-oxide coating. Results are given Table 6.

TABLE 6

| Target Composition | Example No. | Cure Temperature (° C./2 minutes hot plate) | Surface Energy (dyne/cm) | Film Quality |
|---|---|---|---|---|
| $T^{Me}_{0.25}T^{H}_{0.75}$ | C2-1 | 100 | 25.5 | Dewets |
| $T^{Me}_{0.25}T^{H}_{0.75}$ | C2-1 | 150 | 29.5 | Dewets |
| $T^{Me}_{0.50}T^{H}_{0.50}$ | C2-2 | 150 | 29.9 | Dewets |
| $T^{Me}_{0.50}T^{H}_{0.50}$ | C2-2 | 250 | 26 | Dewets |
| $T^{Me}_{0.25}T^{H}_{0.75}$ | C1-1 | 250 | 24.9 | Dewets |
| $T^{Me}_{0.25}T^{H}_{0.75}$ | C1-1 | 350 | 25.9 | Dewets |
| $T^{Me}_{0.50}T^{H}_{0.50}$ | C1-2 | 250 | 27.3 | Dewets |

What is claimed is:

1. A silicone resin comprising 5 to 50 mole % of (PhSiO$_{(3-x)/2}$(OH)$_x$) units and 50 to 95 mole % (HSiO$_{(3-x)/2}$(OH)$_x$) units based on the total amount of silicon containing units in the resin, where Ph is a phenyl group and x has a value of 0, 1 or 2 wherein 6to 38 mole % of the units in the silicone resin contain Si—OH groups.

2. The silicone resin as claimed in claim 1 wherein there is 25 to 50 mole % of (PhSiO$_{(3-x)/2}$(OH)$_x$) units and 50 to 75 mole % (HSiO$_{(3-x)/2}$(OH)$_x$) units in the silicone resin.

3. The silicone resin as claimed in claim 1 wherein there is 30 to 45 mole % of (PhSiO$_{(3-x)/2}$(OH)$_x$ units and 55 to 70 mole % (HSiO$_{(3-x)/2}$(OH)$_x$) units in the silicone resin.

4. A solution comprising (I) a silicone resin comprising 5 to 50 mole % of (PhSiO$_{(3-x)/2}$(OH)$_x$) units and 50 to 95 mole % (HSiO$_{(3-x)/2}$(OH)$_x$) units based on the total amount of silicon containing units in the resin, where Ph is a phenyl group and x has a value of 0, 1 or 2 wherein 6 to 38 mole % of the units in the silicone resin contain Si—OH groups; and (II) 40 to 99.5 wt % of a solvent based pm the weight of(I) and (II).

5. The solution as claimed in claim 4 wherein the solvent is chose from propylene glycol methyl ether acetate, cyclohexanone, γ-butyrolacctone, methyl isobutyl ketone, methyl propyl ketone, mesitylene, silicones.

6. A method of producing a phenylated-oxide dielectric comprising (I) applying silicone resin comprising 5 to 50 mole % of (PhSiO$_{(3-x)/2}$(OH)$_x$) units and 50 to 95 mole % (HSiO$_{(3-x)/2}$(OH)$_x$) units based on the total amount of silicon containing units in the resin, where Ph is a phenyl group and x has a value of 0, 1 or 2 to a substrate wherein 6 to 38 mole % of the units in the silicone resin contain Si—OH groups, and (II) heating the coated substrate to a temperature in the range of 100° C. to 450° C. to cure the silicone resin.

7. The method as claimed in claim 6 wherein there is 25 to 50 mole % of (PhSiO$_{(3-x)/2}$(OH)$_x$) units and 50 to 75 mole % (HSiO$_{(3-x)/2}$(OH)$_x$) units in the silicone resin.

8. The method as claimed in claim 6 wherein there is 30 to 45 mole % of (PhSiO$_{(3-x)/2}$(OH)$_x$) units and 55 to 70 mole % (HSiO$_{(3-x)/2}$(OH)$_x$) units in the silicone resin.

9. The method as claimed in claim 6 wherein the silicone resin is applied to a substrate by spin coating.

10. The method as claimed in claim 6 wherein the silicone resin additionally comprises 40 to 99.5 wt % of a solvent, based on the weight of the silicone resin and solvent.

11. A phenylated-oxide dielectric having a critical surface free energy of at least 30 dynes/cm.

12. The dielectric as claimed in claim 11 wherein the critical surface energy is in the range of 35 to 60 dynes/cm.

13. The dielectric as claimed in claim 11 wherein the critical surface free energy is in the range of 35 to 45 dynes/cm.

14. An integrated circuit comprising a dielectric material wherein the dielectric material comprises (A) at least one organic dielectric layer having a critical surface free energy of at least 40 dynes/cm and (B) at least one phenylated-oxide dielectric layer having a critical surface free energy of at least 30 dynes/cm.

15. The integrated circuit as claimed in claim 14 wherein the phenylated-oxide dielectric layer is applied over the organic dielectric layer.

16. The integrated circuit as claimed in claim 14 wherein the organic dielectric layer is applied over the phenylated-oxide dielectric layer.

17. The integrated circuit as claimed in claim 14 wherein the critical surface free energy of the phenylated-oxide dielectric is in the range of 35 to 60 dynes/cm.

18. The integrated circuit as claimed in claim 14 wherein the critical surface free energy of the phenylated-oxide dielectric is in the range of 35 to 45 dynes/cm.

* * * * *